US008441801B2

(12) United States Patent  (10) Patent No.: US 8,441,801 B2
Kelly  (45) Date of Patent: May 14, 2013

(54) FLEXIBLE MOUNT SYSTEM

(75) Inventor: Paul H. Kelly, Anderson, SC (US)

(73) Assignee: Electrolux Home Products, Inc., Charlotte, NC (US)

( * ) Notice: Subject to any disclaimer, the term of this patent is extended or adjusted under 35 U.S.C. 154(b) by 284 days.

(21) Appl. No.: 12/768,271

(22) Filed: Apr. 27, 2010

(65) Prior Publication Data

US 2011/0261544 A1 Oct. 27, 2011

(51) Int. Cl.
H05K 5/00 (2006.01)

(52) U.S. Cl.
USPC .......................................................... 361/753

(58) Field of Classification Search .................. 361/720, 361/748, 752, 753, 681, 807, 810
See application file for complete search history.

(56) References Cited

U.S. PATENT DOCUMENTS

| 4,171,855 | A  |    | 10/1979 | Raskin          |          |
|-----------|----|----|---------|-----------------|----------|
| 4,359,222 | A  | *  | 11/1982 | Smith et al.    | 463/31   |
| 5,032,737 | A  | *  | 7/1991  | Holm et al.     | 307/9.1  |
| 6,179,429 | B1 | *  | 1/2001  | Sheldon et al.  | 362/26   |
| 6,249,427 | B1 | *  | 6/2001  | Carroll         | 361/679.03 |
| 6,445,585 | B1 |    | 9/2002  | Walker          |          |
| 6,573,843 | B1 | *  | 6/2003  | Murphy          | 341/22   |
| 6,658,868 | B2 |    | 12/2003 | Raab et al.     |          |
| 6,747,578 | B1 | *  | 6/2004  | Lam et al.      | 341/22   |
| 6,854,350 | B2 | *  | 2/2005  | Ayres           | 73/866.3 |
| 7,150,540 | B2 | *  | 12/2006 | Kovacik et al.  | 362/245  |
| 7,264,473 | B1 | *  | 9/2007  | Williams        | 434/227  |
| 7,271,997 | B2 | *  | 9/2007  | Kee et al.      | 361/679.27 |
| 7,515,431 | B1 | *  | 4/2009  | Zadesky et al.  | 361/752  |
| 7,527,386 | B1 | *  | 5/2009  | Salinas Fox et al. | 362/29 |
| 2002/0176242 | A1 | * | 11/2002 | Okamoto       | 361/826  |
| 2004/0042623 | A1 | * | 3/2004  | Zapalski et al.| 381/86   |
| 2005/0126897 | A1 | * | 6/2005  | Stephens      | 200/5 A  |
| 2005/0212717 | A1 |   | 9/2005  | Baumstark     |          |
| 2006/0106965 | A1 | * | 5/2006  | Falcon        | 710/303  |
| 2006/0126274 | A1 | * | 6/2006  | Iwano et al.  | 361/600  |
| 2006/0203463 | A1 | * | 9/2006  | Inoue         | 362/26   |
| 2007/0067119 | A1 | * | 3/2007  | Loewen et al. | 702/57   |
| 2007/0247800 | A1 | * | 10/2007 | Smith et al.  | 361/683  |
| 2008/0037232 | A1 | * | 2/2008  | Schroetlin    | 361/760  |
| 2008/0074830 | A1 | * | 3/2008  | Kurasawa      | 361/681  |
| 2008/0101043 | A1 | * | 5/2008  | Westberg et al.| 361/748 |
| 2008/0130203 | A1 | * | 6/2008  | Doberstein et al.| 361/601 |
| 2008/0165509 | A1 | * | 7/2008  | Kendall et al.| 361/735  |
| 2008/0192393 | A1 | * | 8/2008  | Huang et al.  | 361/45   |
| 2008/0247126 | A1 | * | 10/2008 | Otsuka et al. | 361/681  |

(Continued)

FOREIGN PATENT DOCUMENTS

DE  29907542  8/1999

OTHER PUBLICATIONS

International Search Report for PCT/US2011/034055, dated Sep. 30, 2011, 3 pages.

Primary Examiner — Lisa Lea Edmonds
Assistant Examiner — Xanthia C Cunningham
(74) Attorney, Agent, or Firm — Pearne & Gordon LLP

(57) ABSTRACT

A user panel assembly includes a printed circuit board (PCB), a panel element, a flexible connector and a mounting element. The flexible connector is configured to enable electrical communication between the panel element and the PCB. The mounting element includes a plurality of slots on which the panel element can be mounted. An overlay is configured to conceal a subset of the plurality of slots.

18 Claims, 4 Drawing Sheets

U.S. PATENT DOCUMENTS

| | | | |
|---|---|---|---|
| 2008/0298027 A1* | 12/2008 | Muramatsu | 361/728 |
| 2009/0259147 A1* | 10/2009 | Saikley et al. | 600/583 |
| 2009/0320886 A1* | 12/2009 | Poyner et al. | 134/115 R |
| 2010/0025214 A1* | 2/2010 | Roose et al. | 200/5 A |
| 2010/0202623 A1* | 8/2010 | Snider et al. | 381/58 |
| 2010/0217441 A1* | 8/2010 | Eichman | 700/275 |

* cited by examiner

FLEXIBLE MOUNT SYSTEM

TECHNICAL FIELD

The disclosure relates to a user panel system for an appliance and, more particularly, to a user panel system providing a variety of configurations of panel elements.

BACKGROUND

Appliances often provide user panels for indicating a variety of information, such as relating to operation, etc. While the components of such user panel systems may be similar, the differences between models or types of appliances may require multiple user panel systems to be designed. Thus, a user panel system that can be adjustably altered for the mounting on different models or types of appliances can be beneficial.

SUMMARY

The following presents a simplified summary of the disclosure in order to provide a basic understanding of some example aspects described in the detailed description.

In one example aspect, a user panel assembly is provided for an appliance and includes a printed circuit board (PCB), a panel element, a flexible connector, an a mounting element. The flexible connector is configured to enable electrical communication between the panel element and the PCB. The mounting element includes a plurality of slots on which the panel element can be mounted.

In another example aspect, a user panel assembly is provided for an appliance and includes a printed circuit board (PCB), a panel element, a flexible connector, a mounting element and a first overlay. The flexible connector is configured to enable electrical communication between the panel element and the PCB. The mounting element includes a first slot and a second slot, and the panel element is capable of being mounted on either of the first slot and the second slot. The first overlay is configured to be placed on the mounting element so as to reveal one of the first slot and the second slot and conceal the other of the first slot and the second slot.

In yet another example aspect, a user panel assembly is provided for an appliance and includes a printed circuit board (PCB), a panel element, a flexible connector, a mounting element and an overlay. The flexible connector is configured to enable electrical communication between the panel element and the PCB. The mounting element includes an n+1 number of slots with n being a natural number. The panel element is capable of being mounted in any of the n+1 number of slots. The overlay is configured to be placed on the mounting element and including a n number of openings so as to reveal an n number of slots and conceal at least one slot.

BRIEF DESCRIPTION OF THE DRAWINGS

These and other aspects are better understood when the following detailed description is read with reference to the accompanying drawings, in which.

DETAILED DESCRIPTION

Figure 1:
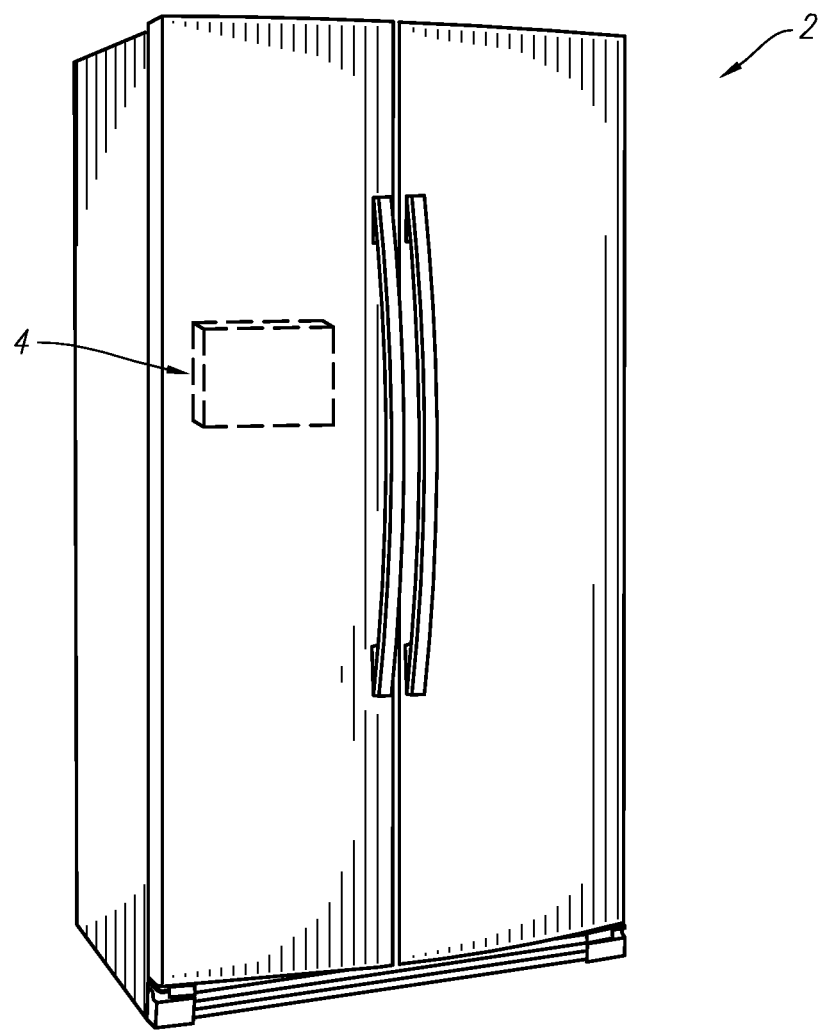
FIG. 1 illustrates an example appliance in which an example user panel assembly can be implemented.

Examples will now be described more fully hereinafter with reference to the accompanying drawings in which example embodiments are shown. Whenever possible, the same reference numerals are used throughout the drawings to refer to the same or like parts. However, aspects may be embodied in many different forms and should not be construed as limited to the embodiments set forth herein.

Referring now to FIG. 1, an example appliance 2 for implementing the present apparatus therein is shown. The appliance 2 may be any type of appliance with a type of user interface or control panel in which a plurality of panel elements may be provided such as a refrigerator, a range, a dishwasher, a washing machine, a dryer, a microwave oven, a freezer, an air conditioner, a video appliance, an audio appliance, a telephone, a camera or the like. The appliance 2 can be used in a home or professional appliances, but will be described herein with reference to an example home appliance. Moreover, while FIG. 1 shows a refrigerator with French style doors, the present apparatus may be applied to various designs of the appliance 2.

As shown in FIGS. 2-6, the present apparatus is a user panel assembly 4 which is shown to be mounted inside a door of the appliance 2. The user panel assembly 4 includes a printed circuit board (PCB) 6, panel elements 8, a flexible connector 10, a mounting element 12, and an overlay 14. The user panel assembly 4 may provide a display or screen that may be visible from the exterior of the appliance 2 or may be initially hidden from view. In the shown examples, two similar panel elements 8 are shown though it is to be understood that various numbers of panel elements having similar or different configurations can be used.

Figure 2:
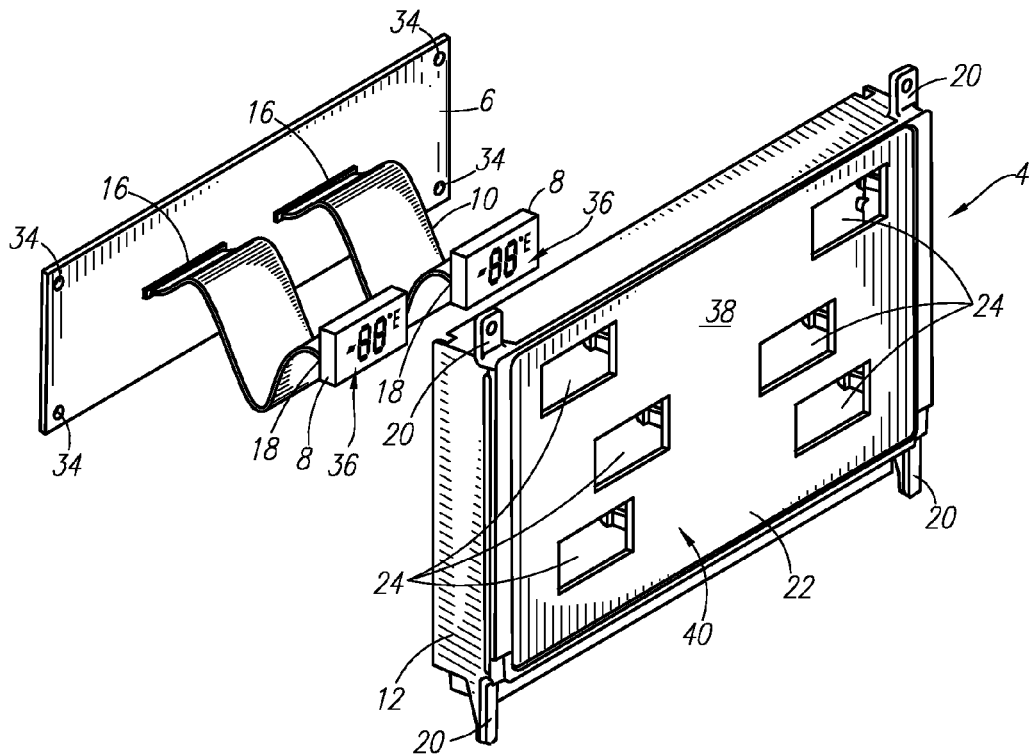
FIG. 2 is an exploded, front perspective view of the user panel assembly of FIG. 2.
Figure 5:
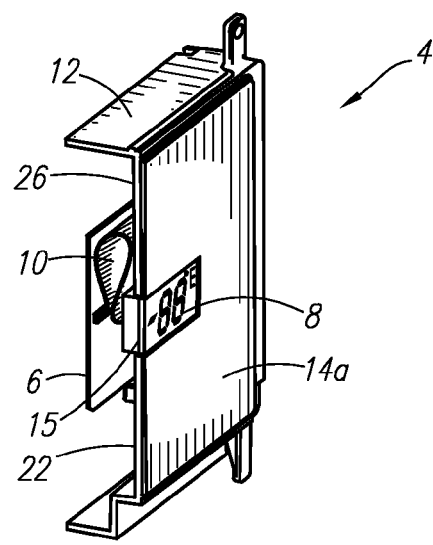
FIG. 5 is a side perspective, cross-sectional view of the user panel assembly along line 5-5 in FIG. 4A.

As shown in FIG. 2, the PCB 6 may be of a type that is commercially available and may include a substrate with conductive paths that electrically connect various electronic components. While many PCBs are rigid, the PCB 6 may be flexible and allow bent shapes to accommodate for mounting. The PCB 6 electrically communicates with and/or controls the panel element 8 through the flexible connector 10. The flexible connector 10 includes a first end 16 connected to the PCB 6 and a second end 18 connected to the panel element 8. The components can be removably or non-removably connected to each other. As shown in FIG. 5, the flexible connector 10 allows the panel element 8 to be spaced apart from the PCB 6 and may be formed as a ribbon cable, one or more wires, combinations, etc. The length of the flexible connector 10 may be such that the panel element 8 is located at a distance from the PCB 6 but not so long as to make a slack portion of the flexible connector 10 an impediment to storage. The PCB 6 may be electrically connected to one or more panel elements 8 and thus there may be more than one flexible connector 10.

Figure 3:
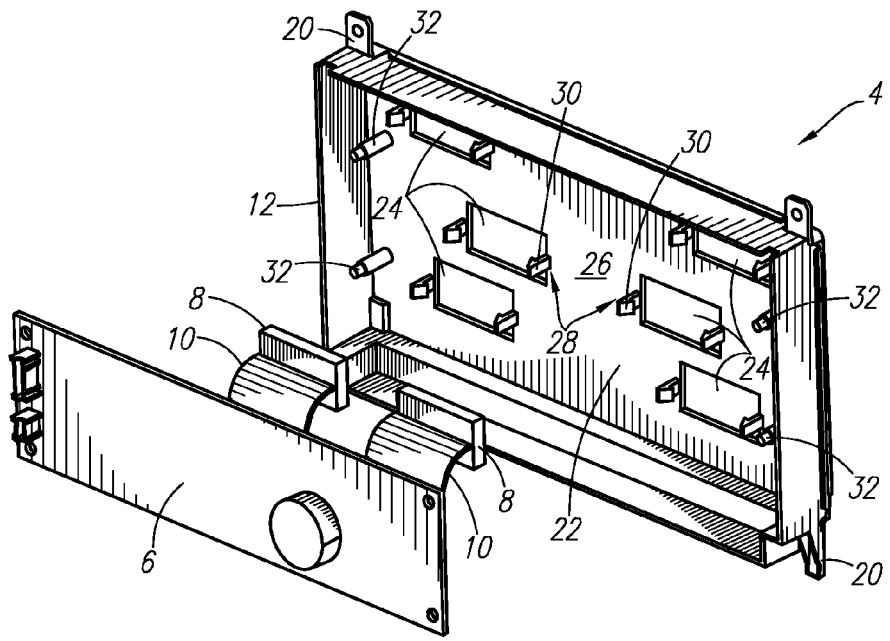
FIG. 3 is an exploded, rear perspective view of the user panel assembly FIG. 2.

Referring to FIGS. 2-3, the mounting element 12 may provide a box-like housing or enclosure in which the components of the user panel assembly 4 can be mounted or housed. The mounting element 12 may include a plurality of tabs 20 of various configurations provided to allow attachment of the mounting element 12 to the appliance 2. The mounting element 12 may be provided with alternative features to enable mounting to the appliance 2. The mounting element 12 includes a wall 22 having one or more slots 24 therethrough that reveal the panel elements 8 mounted on an inner face 26 of the wall 22. In the present embodiment, the mounting element 12 may include six slots 24 with two at the top, two in the middle and two at the bottom. Various other configurations may result in different numbers of slots 24, panel elements 8, etc.

On the inner face 26 of the wall 22 and adjacent each slot 24, an attachment mechanism 28 is provided to secure the panel element 8. In this embodiment, the attachment mechanism 28 is made up of two locking cantilever latches 30 that secure the panel element 8 to the mounting element 12 by way of snap-in. Alternatively, the panel element 8 may also be removably or non-removably secured to the mounting element 12 using glue, screws, nuts/bolts, welding or other means known in the art. The inner face 26 of the mounting element 12 may also include columns 32 for supporting the PCB 6, which is provided with holes 34 so that the columns 32 can be slidingly inserted thereinto. While the PCB 6 is mounted in the mounting element 12 in this embodiment, it may be possible to mount the PCB 6 in a different location, for example, on the appliance 2.

In FIG. 2, the panel element 8 may provide a multi-segment display 36 in order to indicate one or more alphanumeric characters. In the shown example, the display 36 is illustrated as a seven-segment display, though various other multi-segment displays can be used, such as seven-, eight-, nine-, fourteen-, and/or sixteen-segment displays, dot matrix displays, etc. Alternatively, the panel element 8 may simply provide one or more colored lights to indicate, for example, a state of operation of the appliance 2. While this example embodiment contemplates a panel element 8 using a light emitting diode (LED), the panel element 8 may utilize other means of display or indication known in the art such as an organic light emitting diode (OLED), a liquid crystal display (LCD), a plasma display, a cathode ray tube (CRT), or the like. The panel element 8 may also be flexible to facilitate mounting/dismounting on the slots 24.

While the present embodiment utilizes the panel element 8 as a display medium, it may be possible to provide, in place of the shown example panel element 8, static displays, video displays, lighting devices, audio devices (e.g., speakers), buttons/switches, various other analog or digital devices, etc. or a combination thereof for various input and/or output purposes.

The two or more slots 24 on the wall 22 provide a plurality of locations at which the panel element 8 can be secured. The embodiment of FIGS. 2-6 includes two panel elements 8 which can be secured on a selected two of the six slots 24 on the wall 22. The user panel assembly 4 may be usable in different types of appliances or different models of one type of appliance by altering the arrangement of panel elements 8 as desired or as necessary.

Figure 4A:
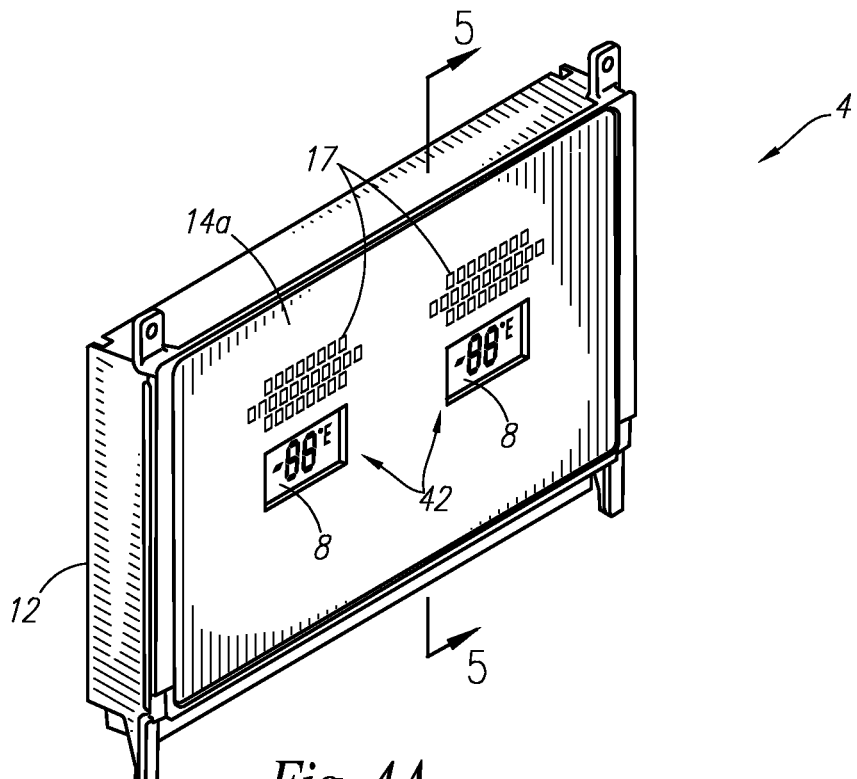
FIG. 4A is a front perspective view of the user panel assembly with a first example overlay.
Figure 4B:
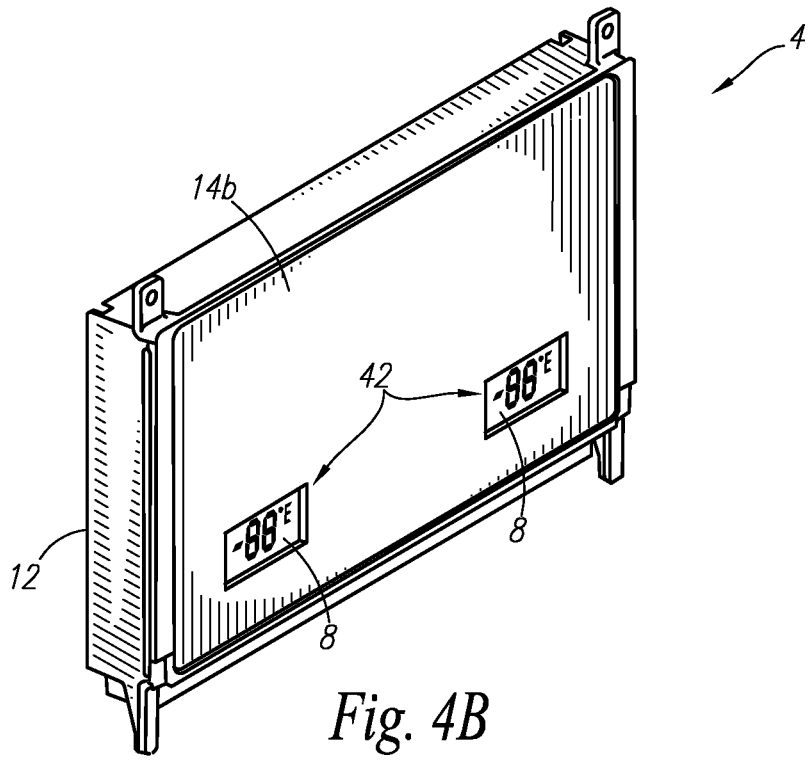
FIG. 4B is similar to FIG. 4A, but shows the user panel assembly with a second example overlay.
Figure 4C:
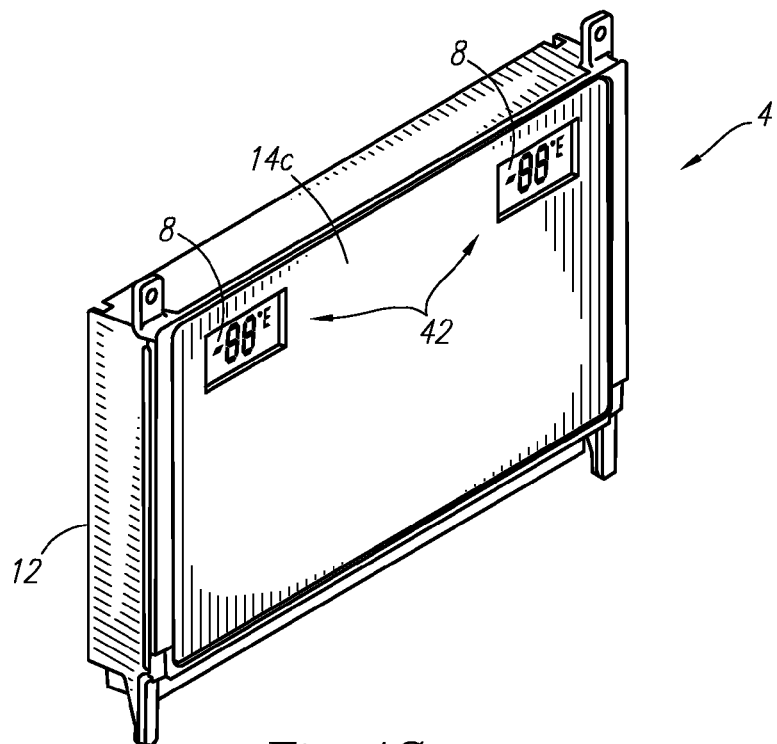
FIG. 4C is similar to FIG. 4A, but shows the user panel assembly with a third example overlay.

An outer side 38 of the wall 22 may include a recessed area 40 (FIG. 2) which is dimensioned to receive one or more overlays snugly. The user panel assembly 4 may include one or more overlays 14 that can interchangeably fit the recessed area 40 (FIGS. 4A-4C). The overlays 14 may be a substantially flat sheet, panel or the like that acts as a cover to a side of the mounting element 12 on which the slots 24 are exposed. While not shown in the figures, the overlays 14 may include a variety of decorative features to suit the appearance of appliance or for other aesthetic purposes. Moreover, the overlay 14 may include markings, texts, icons, symbols or the like, schematically shown as 17 in FIG. 4A, near openings 42 that may further explain the information illustrated by the panel element 8. However, it is not necessary for the overlay 14 to act as an outermost part of the user panel assembly 4 and there may be other components placed on top of the overlay 14.

For example, one overlay 14 may include a first set of one or more openings 42 that match in dimension and position a first subset of the slots 24 on the mounting element 12. Another overlay 14 may include a second set of one or more openings 42 that match in dimension and position a second, different subset of the slots on the mounting element 12. The term "subset" is interpreted to refer to at least one and less than all of the slots on the mounting element 12.

FIG. 4A shows a first example overlay 14a that conceals the slots 24 at the top and the bottom revealing only the two slots 24 in the middle. FIG. 4B shows a second example overlay 14b that conceals the slots 24 at the top and in the middle revealing the slots 24 at the bottom. FIG. 4C shows a third example overlay 14c that conceals the slots 24 in the middle and at the bottom revealing the slots 24 at the top. Thus, depending on the overlay 14 selected for a particular embodiment of the user panel assembly 4, certain slots 24 are revealed while the other slots 24 are concealed by the overlay 14 such that the panel elements 8 are mounted at the revealed slots 24. It is to be understood that the overlay 14 can be adapted to at least partially reveal and/or conceal any particular slot 24. The length of the flexible connector 10 may be such that the same flexible connector 10 can be used for mounting the panel element 8 at any of a plurality of slots 24. The PCB 6 may be mounted at a distance from the wall 22 of the mounting element 12 such that a slack portion of the flexible connector may be stored between the PCB 6 and the wall 22 in a folded configuration as shown in FIG. 5. The overlay 14 may include a layer 15 above the panel element 8 that covers or protects the panel element. The layer 15 may be transparent, translucent, colored, etc.

The overlay 14 may be configured to conceal at least one slot in which a panel element 8 is not mounted. In other words, there may be at least an n+1 number of slots 24 on the mounting element 12 and the overlay 14 may include an n number of openings 42 which match in dimension and position a subset of the total n+1 slots 24, for example, an n number of the slots 24, such that an n number of slots 24 are revealed while one of the slots 24 is concealed. An n number (or a smaller number) of panel elements 8 may mounted in the revealed slots 24. The number n is a natural number. In one example, the mounting element 12 can include three (3) slots 24 while the overlay 14 includes two (2) openings 42, such that two of the slots 24 are revealed while one slot 24 is concealed. In the shown example, the mounting element 12 can include six (6) slots 24 while the overlay 14 includes two (2) openings 42, such that two of the slots 24 are revealed while four slots 24 are concealed. In yet another example, a second overlay (e.g., see FIGS. 4A-4C) can be provided including a $n_2$ number of openings so as to reveal an $n_2$ number of slots and conceal at least one slot. The number $n_2$ can be a different number (e.g., greater or lesser) as compared to n, or may even be the same number of openings having a different configuration as compared to the n openings so as to reveal/conceal a different configuration of slots.

The adaptability of the location of the panel elements in the shown example is made possible by the flexible connector which allows each panel element to be mounted at multiple locations on the wall of the mounting element. However, it may also be possible to provide panel elements for slots without using flexible connectors, for example, by assembling the panel elements with respect to the PCB using semi-flexible and/or non-flexible connectors, such that their locations correspond generally with those of the slots.

It will be apparent to those skilled in the art that various modifications and variations can be made without departing from the spirit and scope of the claimed invention.

What is claimed is:

1. A user panel assembly for an appliance including:
   a printed circuit board (PCB);
   a panel element;
   a flexible connector configured to enable electrical communication between the panel element and the PCB;
   a mounting element including a plurality of slots, the panel element configured to be moved from one of the plurality of slots to another of the plurality of slots, the panel element dimensioned to fit within one of the plurality of slots; and
   an overlay configured to conceal a subset of the plurality of slots when the overlay is installed on the mounting element.

2. The assembly of claim 1, further including a first overlay and a second overlay, the first overlay configured to conceal a first subset of the plurality of slots and the second overlay configured to conceal a second subset of the plurality of slots, the second overlay configured to be used in place of the first overlay.

3. The assembly of claim 1, wherein the panel element is spaced apart from the PCB once the panel element is mounted on the mounting element.

4. The assembly of claim 1, wherein the panel element is removably mounted on the mounting element.

5. The assembly of claim 1, wherein the panel element includes a light emitting diode (LED) and is flexible.

6. The assembly of claim 1, wherein the PCB is mounted on the mounting element.

7. The assembly of claim 1, wherein the flexible connector is a ribbon cable.

8. The assembly of claim 1, the panel element mounted at the subset of the plurality of slots.

9. A user panel assembly for an appliance including:
   a printed circuit board (PCB);
   a panel element;
   a flexible connector configured to enable electrical communication between the panel element and the PCB;
   a mounting element including a first slot and a second slot, the panel element capable of being mounted in either of the first slot and the second slot, the panel element dimensioned to fit within either of the first slot and the second slot; and
   a first overlay configured to be placed on the mounting element so as to reveal one of the first slot and the second slot and conceal the other of the first slot and the second slot.

10. The assembly of claim 9, further including a second overlay configured to reveal the other of the first slot and the second slot and conceal the one of the first slot and the second slot, the second overlay configured to be used in place of the first overlay.

11. The assembly of claim 9, wherein the panel element includes a light emitting diode (LED) and is flexible.

12. The assembly of claim 9, wherein the mounting element includes a wall and the first slot and the second slot are formed on the wall.

13. The assembly of claim 9, wherein the panel element is spaced apart from the PCB once the panel element is mounted on the mounting element.

14. The assembly of claim 9, wherein the panel element includes a multi-segment display.

15. The assembly of claim 9, wherein the PCB is mounted on the mounting element.

16. The assembly of claim 9, wherein the flexible connector is of such length as to allow the panel element to be mounted on either of the first slot and the second slot.

17. A user panel assembly for an appliance including:
   a printed circuit board (PCB);
   a panel element;
   a flexible connector configured to enable electrical communication between the panel element and the PCB;
   a mounting element including at least an n+1 number of slots, n being a natural number, the panel element capable of being mounted in any of the n+1 number of slots, the panel element dimensioned to fit within any of the n+1 number of slots; and
   an overlay configured to be placed on the mounting element and including a n number of openings so as to reveal an n number of slots and conceal at least one slot.

18. The assembly of claim 17, further including a second overlay including a $n_2$ number of openings so as to reveal an $n_2$ number of slots and conceal at least one slot, the second overlay configured to be used in place of the first overlay.

* * * * *